(12) United States Patent
Sakai et al.

(10) Patent No.: US 11,342,694 B2
(45) Date of Patent: May 24, 2022

(54) TERMINAL AND BOARD CONNECTOR

(71) Applicant: Sumitomo Wiring Systems, Ltd., Yokkaichi (JP)

(72) Inventors: Hiroto Sakai, Yokkaichi (JP); Hidekazu Matsuda, Yokkaichi (JP); Yuichi Nakanishi, Yokkaichi (JP)

(73) Assignee: Sumitomo Wiring Systems, Ltd.

( * ) Notice: Subject to any disclaimer, the term of this patent is extended or adjusted under 35 U.S.C. 154(b) by 0 days.

(21) Appl. No.: 16/927,055

(22) Filed: Jul. 13, 2020

(65) Prior Publication Data
US 2021/0036444 A1 Feb. 4, 2021

(30) Foreign Application Priority Data

Jul. 31, 2019 (JP) .............................. JP2019-140699

(51) Int. Cl.
*H01R 24/00* (2011.01)
*H01R 12/58* (2011.01)
(Continued)

(52) U.S. Cl.
CPC ........... *H01R 12/585* (2013.01); *H01R 12/57* (2013.01); *H01R 12/716* (2013.01);
(Continued)

(58) Field of Classification Search
CPC ......................... H01R 12/716; H01R 12/724; H01R 13/6587; H01R 12/585; H01R 13/41; H01R 12/721; H01R 12/737; H01R 13/514; H01R 12/57; H01R 12/58; H01R 12/73; H01R 12/91; H01R 13/405; H01R 13/6471; H01R 13/6315; H01R 43/20; H01R 12/7005; H01R 12/7064; H01R 13/502; H01R 13/6461; H01R 13/6585; H01R 12/7076;
(Continued)

(56) References Cited

U.S. PATENT DOCUMENTS

2005/0118892 A1* 6/2005 Shindo ................... H01R 13/05
439/857
2005/0277312 A1* 12/2005 Nakamura ............. H01R 13/41
439/82
(Continued)

FOREIGN PATENT DOCUMENTS

JP 2006-059654 3/2006

*Primary Examiner* — Truc T Nguyen
(74) *Attorney, Agent, or Firm* — Gerald E. Hespos; Michael J. Porco; Matthew T. Hespos

(57) ABSTRACT

A terminal (11) to be mounted into a housing (20) mounted on a circuit board (40) includes a terminal contact portion (12) to be disposed in a forwardly open receptacle (21) of the housing (20), an inserting portion (14) to be inserted into a terminal insertion hole (24) penetrating through a rear wall (22) of the receptacle (21) in a front-rear direction, and a board connecting portion (16) to be drawn out rearward from the terminal insertion hole (24) and connected to the circuit board (40). The inserting portion (14) includes a first press-fit portion (31) projecting in a first direction intersecting the circuit board (40) and to be press-fit to an inner wall of the terminal insertion hole (24) and a second press-fit portion (33) projecting in a second direction intersecting the first direction and to be press-fit to the inner wall of the terminal insertion hole (24).

12 Claims, 14 Drawing Sheets

(51) Int. Cl.
*H01R 12/71* (2011.01)
*H01R 12/72* (2011.01)
*H05K 3/30* (2006.01)
*H01R 12/57* (2011.01)

(52) U.S. Cl.
CPC ............. *H01R 12/724* (2013.01); *H05K 3/30* (2013.01); *H05K 2201/10189* (2013.01)

(58) Field of Classification Search
CPC .............. H01R 13/2442; H01R 13/518; H01R 13/6474; H01R 13/6582; H01R 13/6594; H01R 24/60; H01R 43/24; H01R 12/55; H01R 12/707; H01R 12/714; H01R 12/722; H01R 12/727; H01R 12/79; H01R 13/04; H01R 13/11; H01R 13/111; H01R 13/187; H01R 13/5216; H01R 13/6473; H01R 13/6477; H01R 13/6599; H01R 2201/26; H01R 43/205; H01R 12/52; H01R 12/523; H01R 12/53; H01R 12/71; H01R 12/718; H01R 12/732; H01R 12/75; H01R 13/025; H01R 13/03; H01R 13/115; H01R 13/17; H01R 13/2492; H01R 13/26; H01R 13/28; H01R 13/422; H01R 13/50; H01R 13/5202; H01R 13/521; H01R 13/6205; H01R 13/6272; H01R 13/6273; H01R 13/642; H01R 13/6581; H01R 13/6583; H01R 13/6586; H01R 13/659; H01R 13/6593; H01R 13/6598; H01R 2107/00; H01R 33/0845; H01R 43/0256; H01R 43/16; H01R 11/28; H01R 11/30; H01R 11/32; H01R 12/00; H01R 12/515; H01R 12/61; H01R 12/7011; H01R 12/7023; H01R 12/7029; H01R 12/7035; H01R 12/72; H01R 12/725; H01R 12/78; H01R 12/82; H01R 12/85; H01R 13/05; H01R 13/055; H01R 13/057; H01R 13/10; H01R 13/112; H01R 13/113; H01R 13/14; H01R 13/193; H01R 13/24; H01R 13/2464; H01R 13/415; H01R 13/4223; H01R 13/424; H01R 13/504; H01R 13/506; H01R 13/516; H01R 13/5219; H01R 13/533; H01R 13/585; H01R 13/6271; H01R 13/6275; H01R 13/648; H01R 13/6592; H01R 13/665; H01R 13/6658; H01R 13/73; H01R 2101/00; H01R 2103/00; H01R 24/30; H01R 24/76; H01R 24/84; H01R 24/86; H01R 25/006; H01R 27/00; H01R 33/74; H01R 43/00; H01R 43/005; H01R 43/26; H01R 4/02; H01R 4/185; H01R 4/2433; H01R 4/2454; H01R 4/2466; H01R 4/48; H01R 4/5041; H01R 4/5075; H01R 4/62; H01R 9/0518; H01R 9/2408; H01R 12/712; H01R 13/629; H05K 3/30; H05K 2201/10189; H05K 3/3426; Y02P 70/50

See application file for complete search history.

(56) References Cited

U.S. PATENT DOCUMENTS

| | | | |
|---|---|---|---|
| 2006/0014438 A1* | 1/2006 | Regnier | H01R 13/41 439/637 |
| 2006/0040568 A1 | 2/2006 | Sasaki et al. | |
| 2009/0124140 A1* | 5/2009 | Shuey | H01R 12/716 439/884 |
| 2011/0201237 A1* | 8/2011 | Suzuki | H01R 12/585 439/884 |
| 2012/0149228 A1* | 6/2012 | Matsumoto | H01R 13/4223 439/329 |
| 2012/0164851 A1* | 6/2012 | Shindo | H01R 12/724 439/55 |
| 2012/0264334 A1* | 10/2012 | Laurx | H01R 13/6471 439/628 |
| 2015/0079851 A1* | 3/2015 | Endo | H01R 13/73 439/736 |
| 2017/0018867 A1* | 1/2017 | Kimura | H01R 13/6581 |
| 2017/0302016 A1* | 10/2017 | Watanabe | C25D 7/00 |
| 2019/0334288 A1* | 10/2019 | Horii | H01R 13/6315 |
| 2020/0185851 A1* | 6/2020 | Tanaka | H01R 13/41 |
| 2021/0036444 A1* | 2/2021 | Sakai | H05K 3/30 |
| 2021/0388867 A1* | 12/2021 | Ribeiro | F16C 43/06 |

* cited by examiner

FIG. 10
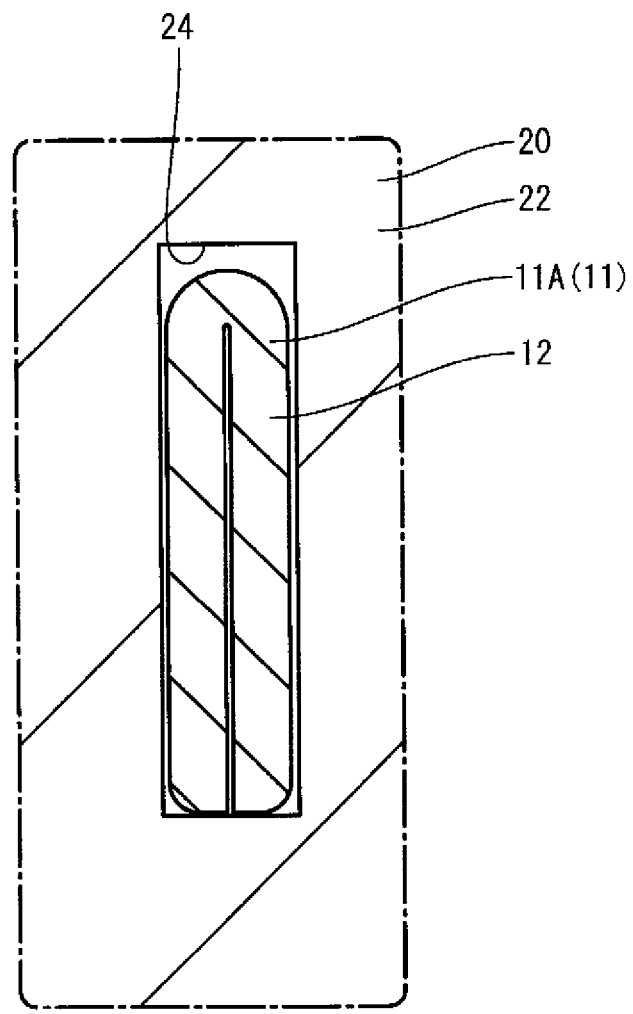
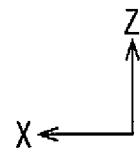

TERMINAL AND BOARD CONNECTOR

BACKGROUND

Field of the Invention

This disclosure relates to a terminal and a board connector.

Related Art

Japanese Unexamined Patent Publication No. 2006-59654 describes a terminal to be disposed in a board connector that is to be mounted on a circuit board. This terminal has projections on a part of the thin plate-like terminal portion to be inserted into a terminal mounting hole of a connector housing. The projections project in opposite directions intersecting an extending direction of a thin plate-like terminal portion. In this way, the terminal and the connector housing are positioned by press-fitting the projections to an inner wall of the terminal mounting hole with the thin plate-like terminal inserted in the terminal mounting hole of the connector housing.

However, the presence of the projections results in the thin plate-like terminal portion being held with a clearance defined between the inner wall of the terminal mounting hole and the thin plate-like terminal portion. In other words, the thin plate-like terminal portion is held in a floating state on the inner wall of the terminal mounting hole with the projections as fulcrums. Thus, there is a concern that the thin plate-like terminal portion rotates in a vertical or lateral direction in the terminal mounting hole with the projections as fulcrums.

This disclosure was completed on the basis of the above situation and aims to improve the positioning accuracy of a terminal and a housing.

SUMMARY

This disclosure relates to a terminal to be mounted into a housing mounted on a circuit board. The terminal includes a terminal contact portion to be disposed in a forwardly open receptacle of the housing, an inserting portion to be inserted into a terminal insertion hole penetrating through a rear wall of the receptacle in a front-rear direction, and a board connecting portion to be drawn out rearward from the terminal insertion hole and connected to the circuit board. The inserting portion includes first and second press-fit portions. The first press-fit portion projects in a first direction intersecting the circuit board and is press-fit to an inner wall of the terminal insertion hole. The second press-fit portion projects in a second direction intersecting the first direction and is press-fit to the inner wall of the terminal insertion hole.

If the first press-fit portion is press-fit to the inner wall of the terminal insertion hole, a side wall of the inserting portion on a side opposite to the first press-fit portion in the first direction contacts the inner wall of the terminal insertion hole on a side opposite to a side where the first press-fit portion is press-fit. In this way, the housing and the terminal are positioned in the first direction intersecting the circuit board, and the positioning accuracy of the circuit board and the board connecting portion to be connected to the circuit board can be improved.

Further, if the second press-fit portion is press-fit to the inner wall of the terminal insertion hole, a side wall of the inserting portion on a side opposite to the second press-fit portion in the second direction contacts the inner wall of the terminal insertion hole on a side opposite to a side where the second press-fit portion is press-fit. In this way, the housing and the terminal are positioned in the second direction so that the positioning accuracy of the circuit board and the board connecting portion to be connected to the circuit board is improved further.

A front part of the first press-fit portion may be located in front of the second press-fit portion. Thus, the first press-fit portion is press-fit to the inner wall of the terminal insertion hole earlier than the second press-fit portion. In this way, the terminal and the housing initially are positioned relative to each other in the first direction, thereby improving the positioning accuracy of the circuit board and the board connecting portion to be connected to the circuit board.

A rearwardly extending draw-out portion may be provided between the inserting portion and the board connecting portion and may be drawn out rearward from the terminal insertion hole. Additionally, a stopper may project from the draw-out portion in a direction intersecting the front-rear direction. The stopper may be configured to contact an edge of the terminal insertion hole from behind. The contact of the stopper with the edge of the terminal insertion hole from behind holds the terminal in a state stopped in front with respect to the receptacle. In this way, the positioning accuracy of the housing and the terminal is improved.

The inserting portion may have a first contact surface configured to contact the inner wall of the terminal insertion hole on a side opposite to the first press-fit portion in the first direction, thereby further improving the positioning accuracy of the terminal and the housing in the first direction.

The inserting portion may have a second contact surface that contacts the inner wall of the terminal insertion hole on a side opposite to the second press-fit portion in the second direction. This surface contact of the second contact surface with the inner wall of the terminal insertion hole further improves the positioning accuracy of the terminal and the housing in the second direction.

The disclosure also is directed to a board connector with the above-described terminal and a housing to be mounted on a circuit board. The housing includes a forwardly open receptacle and a terminal insertion hole penetrating through a rear wall of the receptacle in a front-rear direction.

BRIEF DESCRIPTION OF DRAWINGS

FIG. 10 is a section along X-X in FIG. 9.

DETAILED DESCRIPTION

Figure 1:
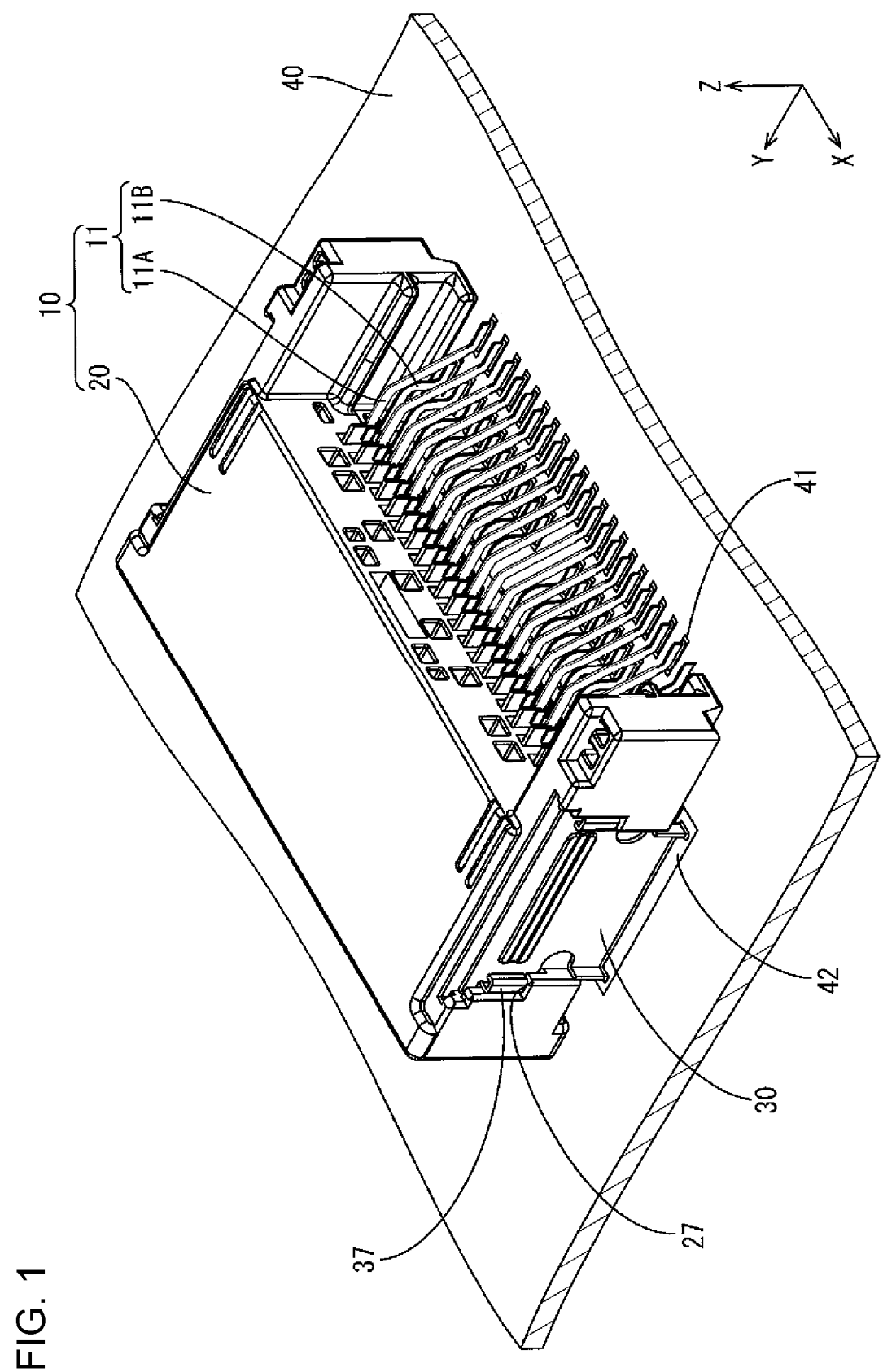
FIG. 1 is a perspective view showing a state where a board connector according to one embodiment is mounted on a circuit board.
Figure 2:
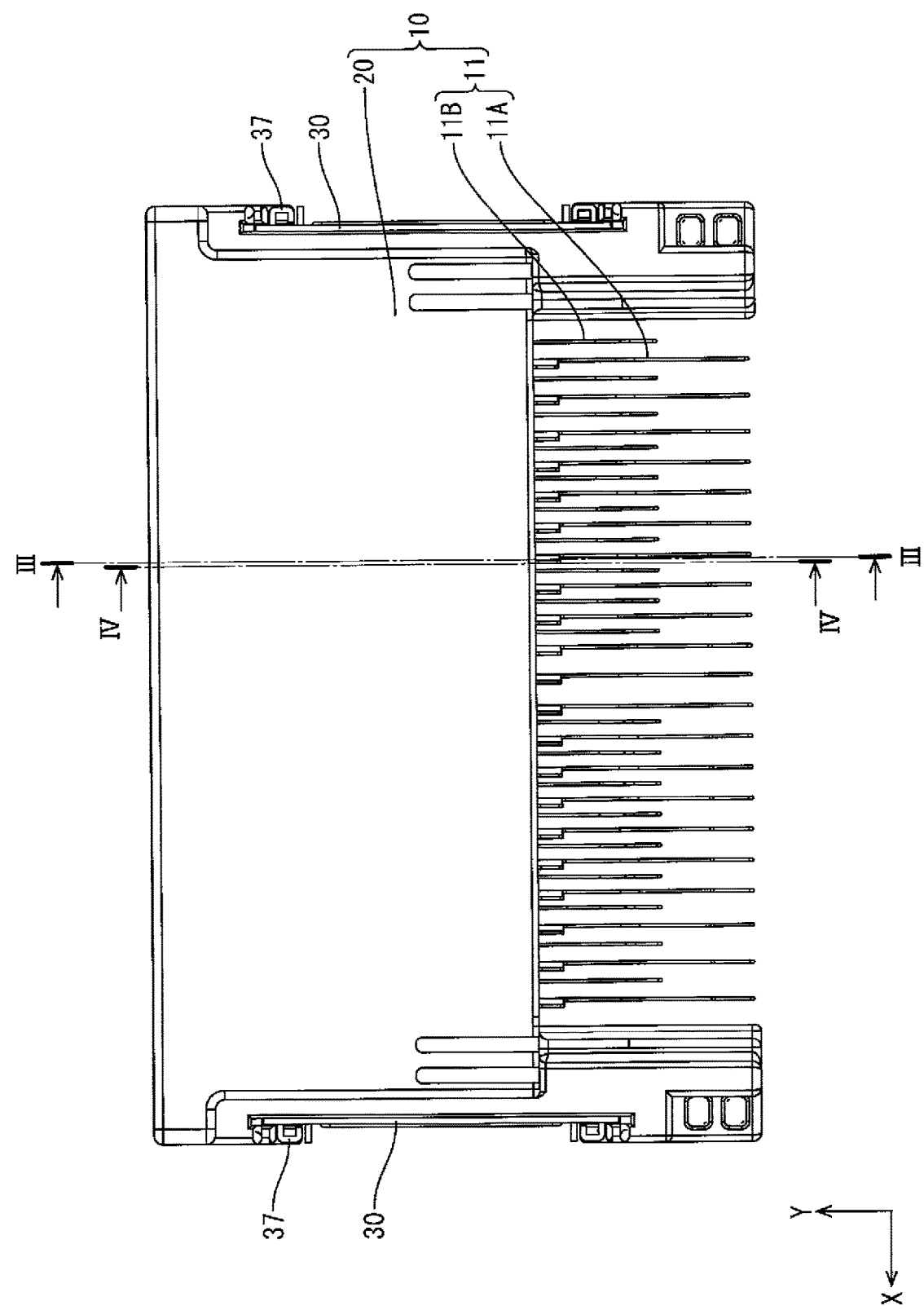
FIG. 2 is a plan view showing the board connector.

One embodiment of disclosure is described with reference to FIGS. 1 to 14. Note that these illustrations are not intended to limit the invention, but rather are intended to be an example of the invention defined by the claims, including all changes in the scope of claims and in the meaning and scope of equivalents. As shown in FIGS. 1 and 2, a board connector 10 of this embodiment has terminals 11 mounted in a housing 20 that is to be placed on a circuit board 40. Each terminal 11 is connected to the circuit board 40 by reflow soldering. Fixing brackets 30 are mounted on both side surfaces of the housing 20 and these fixing brackets 30 also are fixed onto the circuit board 40 by reflow soldering. In the following description, a direction indicated by an arrow Z is referred to as an upward direction, a direction indicated by an arrow Y is referred to as a forward direction and a direction indicated by an arrow X is referred to as a leftward direction. Further, some identical members may be denoted by a reference sign and the other members may not be denoted by the reference sign.

[Housing 20]

Figure 3:
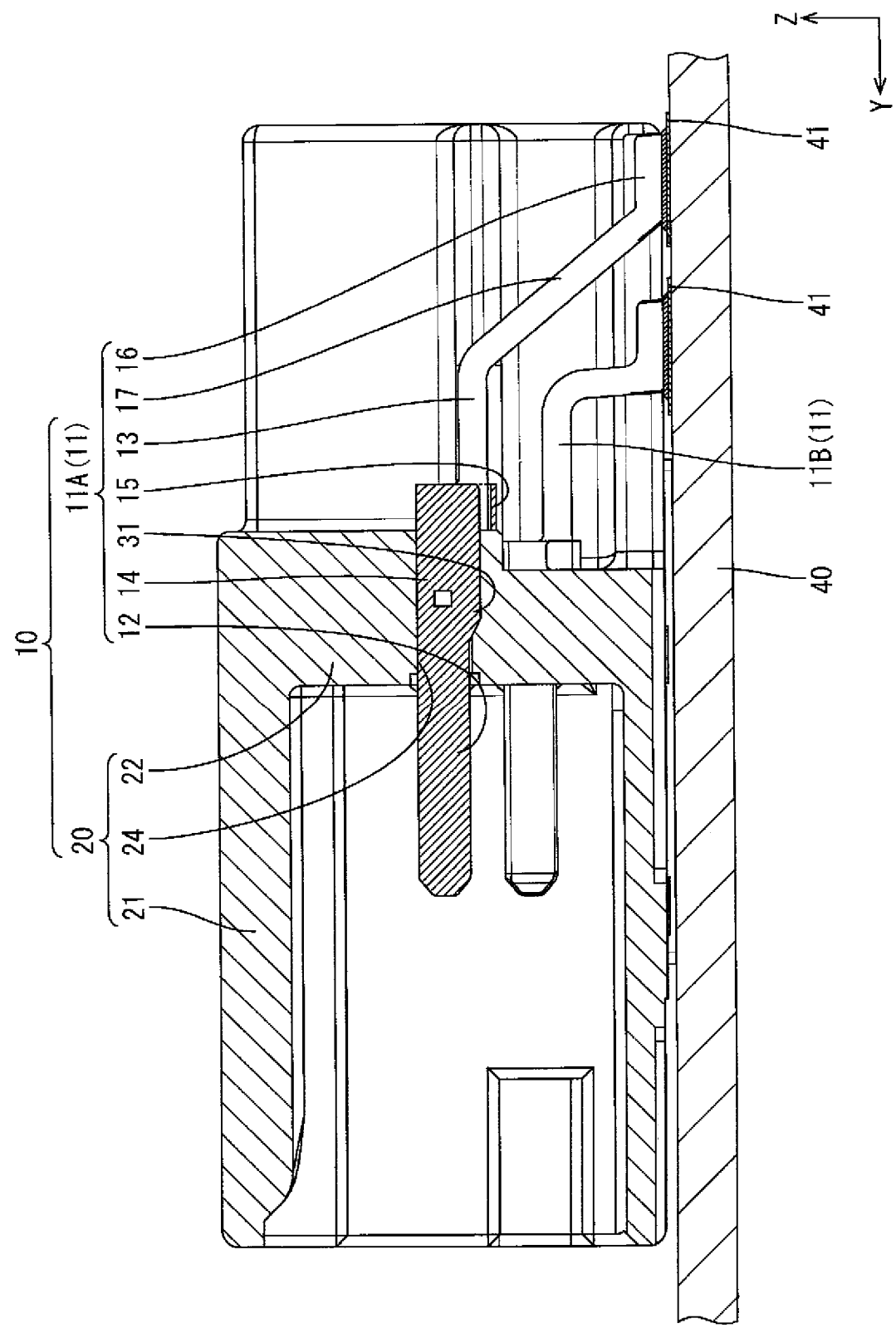
FIG. 3 is a section along in FIG. 2.
Figure 4:
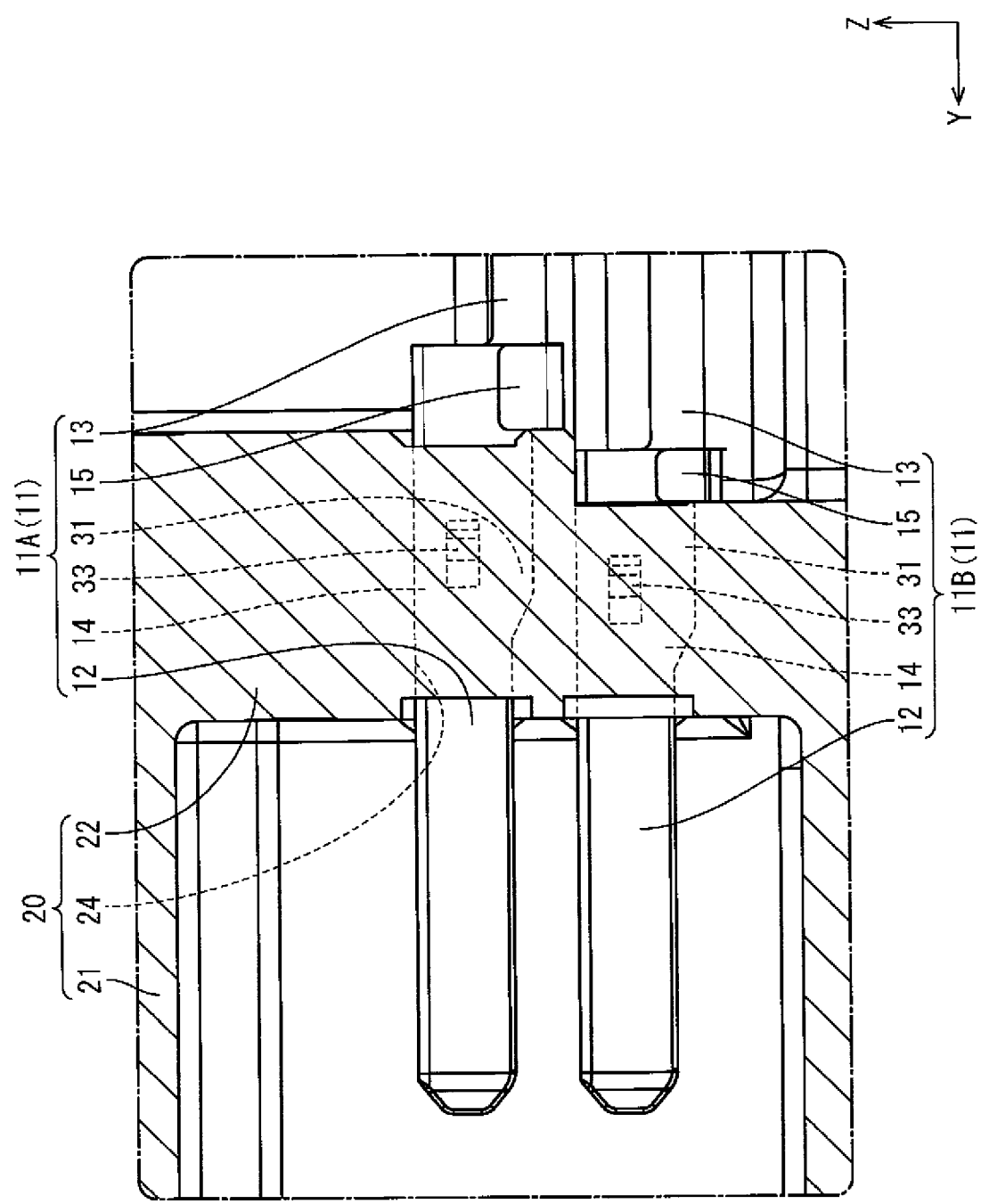
FIG. 4 is a section along IV-IV in FIG. 2.

The housing 20 is made of synthetic resin and, as shown in FIGS. 1 and 2, is in the form of a wide block. As shown in FIG. 3, a forwardly open receptacle 21 is formed in the front surface of the housing 20 and can receive a mating female housing (not shown). As shown in FIG. 4, a rear wall 22 is formed behind the receptacle 21, and terminal insertion holes 24 are formed side by side in a lateral direction in upper and lower stages of the rear wall 22. Terminal contact portions 12 and inserting portions 14 of the terminals 11 are press-fit into the terminal insertion holes 24 from behind, as described later.

[Terminals 11]

As shown in FIG. 3, the terminals 11 include tall first terminals 11A and short second terminals 11B. Note that the first and second terminals 11A, 11B are described as the terminals 11 when a common configuration is described.

Figure 5:
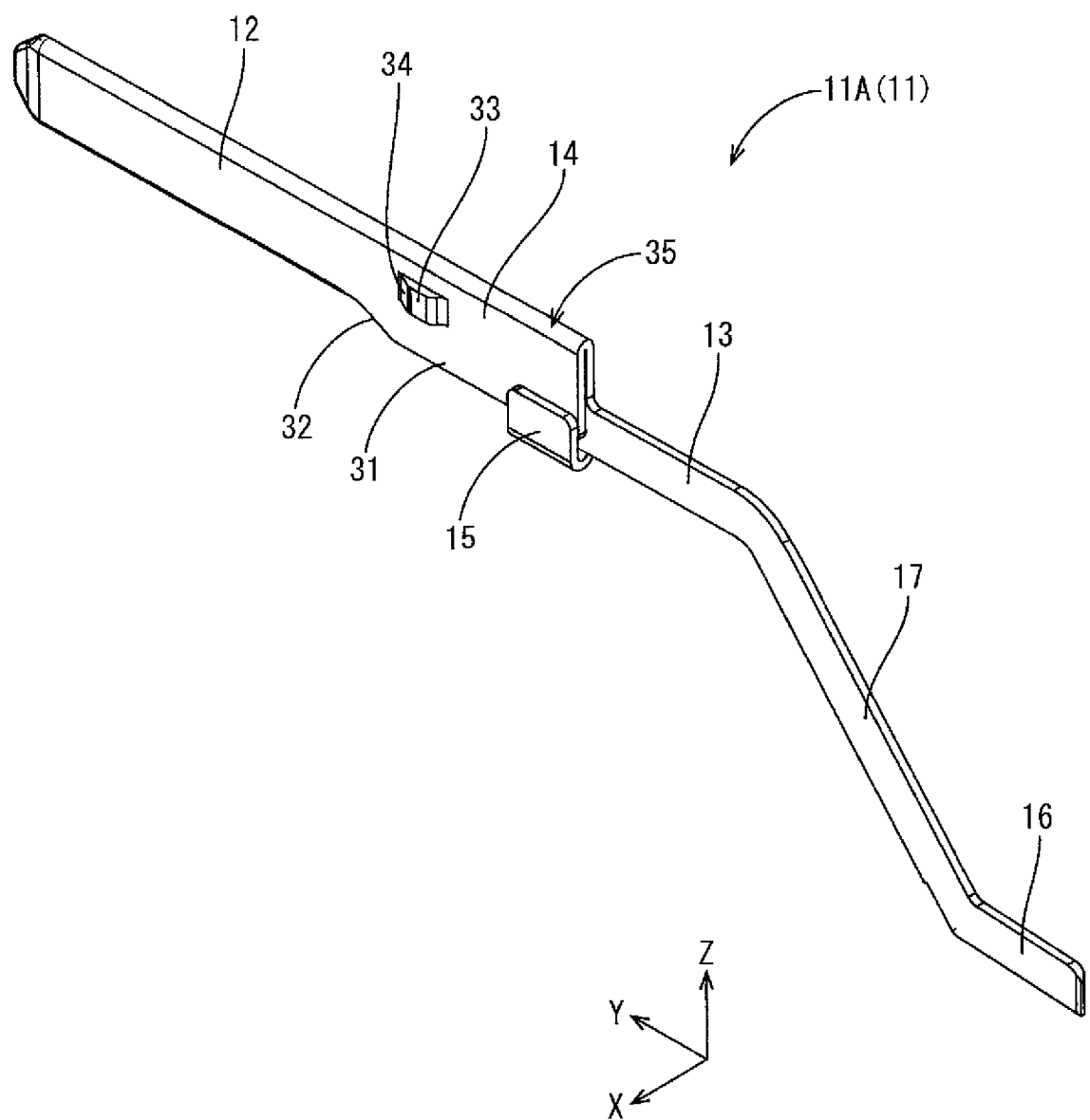
FIG. 5 is a perspective view showing a terminal.
Figure 6:
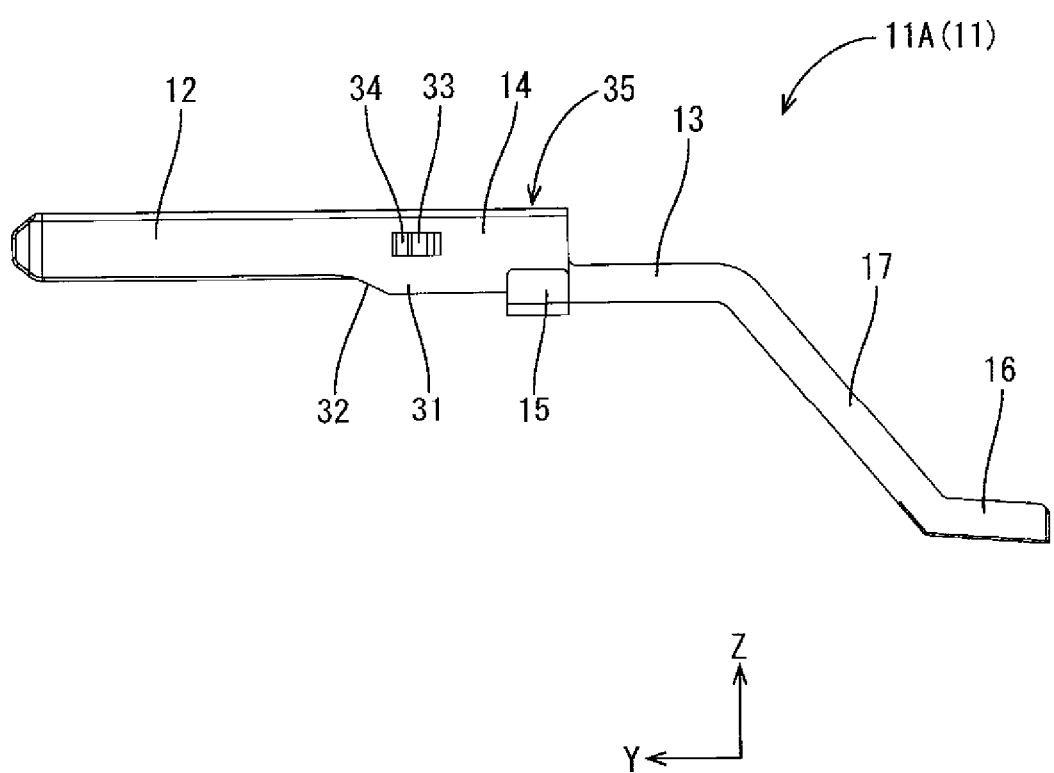
FIG. 6 is a side view showing the terminal.

Each terminal 11 is formed by bending an elongated metal plate material into a predetermined shape, as shown in FIGS. 5 and 6. One end of the terminal 11 serves as the terminal contact portion 12 to be connected to a female terminal (not shown) mounted in the mating housing, whereas the other end serves as a board connecting portion 16 to be connected by soldering to a terminal land 41 on the circuit board 40. The terminals 11 are sorted into the first terminals 11A and the second terminals 11B based on the height of a draw-out portion 13 from the circuit board 40. The terminal lands 41 are connected to conductive paths (not shown) formed on the circuit board 40 by a printed wiring technique.

Note that fixing lands 42 to be described later also are formed on the circuit board 40 by the printed wiring technique. The fixing lands 42 may or may not be connected to the conductive paths.

The terminal contact portion 12 is in the form of a plate elongated in a front-rear direction and flat in the lateral direction. The terminal contact portion 12 is inserted from behind into the terminal insertion hole 24 of the housing 20. The terminal contact portion 12 is located in the receptacle 21 of the housing 20 (see FIG. 3).

As shown in FIG. 3, the inserting portion 14 to be located in the terminal insertion hole 24 of the housing 20 is provided behind the terminal contact portion 12. A first press-fit portion 31 projects down (an example of a first direction) on the lower edge of the inserting portion 14. The first press-fit portion 31 is press-fit to a lower wall (an example of an inner wall) of the terminal insertion hole 24. A first inclined surface 32 is formed on a front part of the first press-fit portion 31. This first inclined surface 32, guides the inserting portion 14 to a proper position in the terminal insertion hole 24 with respect to a vertical direction.

Figure 7:
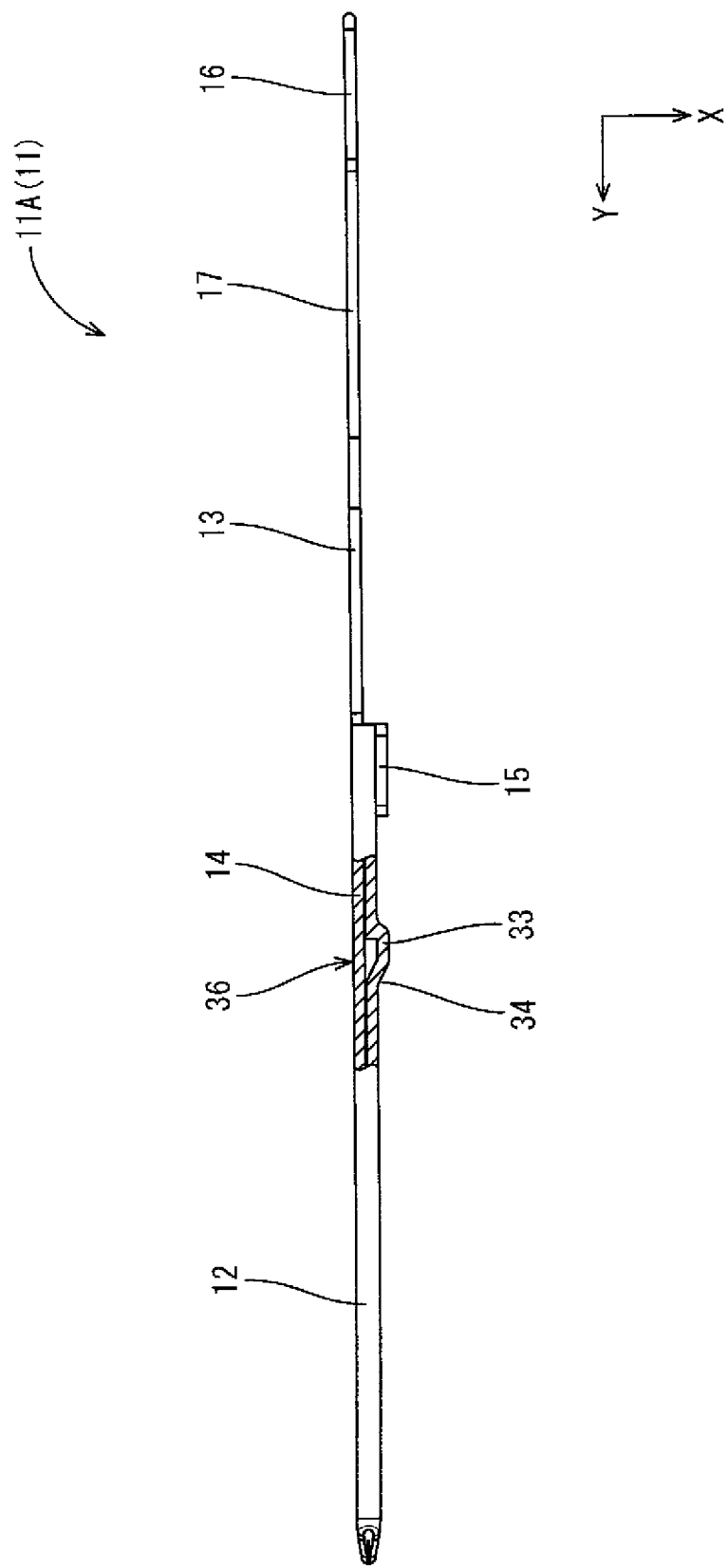
FIG. 7 is a plan view partly in section showing the terminal.

As shown in FIG. 7, a left side surface of the inserting portion 14 is struck to form a second press-fit portion 33 projecting leftward (an example of a second direction). The second press-fit portion 33 is press-fit to a left side wall (an example of the inner wall) of the terminal insertion hole 24. A second inclined surface 34 is formed on a front part of the second press-fit portion 32. This second inclined surface 34 guides the inserting portion 14 to a proper position in the terminal insertion hole 24 with respect to the lateral direction.

As shown in FIG. 6, the front part of the first press-fit portion 31 is located in front of the second press-fit portion 33. In this way, when the inserting portion 14 is inserted into the terminal insertion hole 24 from behind, the first press-fit portion 31 contacts the edge of the terminal insertion hole 24 from behind earlier than the second press-fit portion 33 and is press-fit to the lower wall of the terminal insertion hole 24.

As shown in FIG. 6, the draw-out portion 13 of the terminal 11 extends rearward and is drawn out rearward from the terminal insertion hole 24. A stopper 15 projects down on a front part of the draw-out portion 13 and contacts the edge of the terminal insertion hole 24 from behind.

Figure 8:
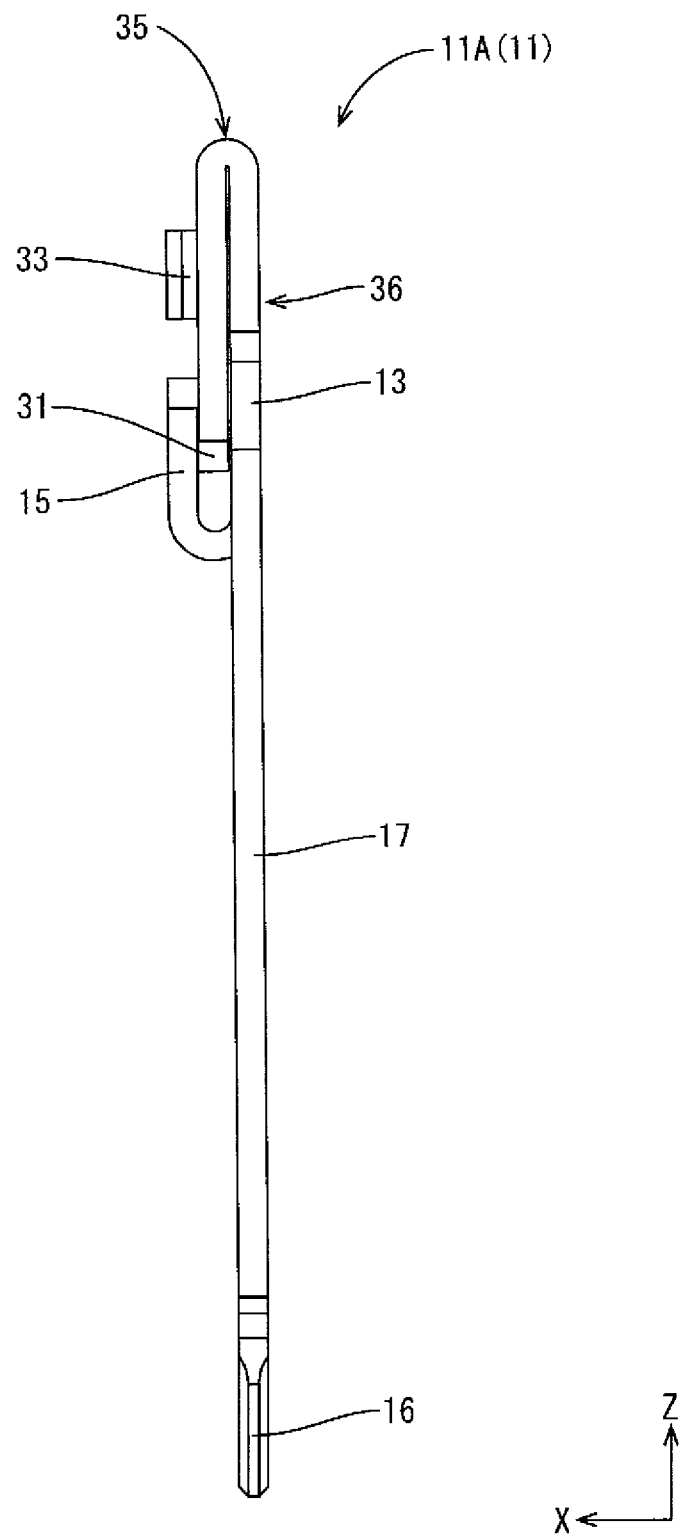
FIG. 8 is a back view showing the terminal.

As shown in FIG. 8, the terminal contact portion 12 and the inserting portion 14 are formed by downwardly bending the upper edge of a right side wall of a part of the metal plate material constituting the terminal contact portion 12 and the inserting portion 14. In this way, the terminal contact portion 12 and the inserting portion 14 have a thickness in the lateral direction that is twice the thickness of the metal plate material.

A lower part of the part of the metal plate material constituting the terminal contact portion 12 and the inserting portion 14 is held by the stopper 15 bent upward from the lower edge of the right edge of the part of the metal plate material constituting the terminal contact portion 12 and the inserting portion 14 with leftward opening prevented.

A first contact surface 35 constituted by a curved surface is formed on the upper end edge of the inserting portion 14. This first contact surface 35 is an upwardly convex curved surface. The first contact surface 35 comes into surface contact with an upper wall of the terminal insertion hole 24 from below with the first press-fit portion 31 press-fit to the lower wall of the terminal insertion hole 24.

A right surface of the inserting portion 14 serves as a second contact surface 36. This second contact surface 36 comes into surface contact with a right side wall of the terminal insertion hole 24 from the left with the second press-fit portion 33 press-fit to the left side wall of the terminal insertion hole 24.

As shown in FIG. 6, the terminal 11 has a descending portion 17 extending obliquely to a lower-rear side from a rear part of the draw-out portion 13. Since this terminal 11 is mounted on the terminal land 41 formed on a surface of the circuit board 40 by reflow soldering, the lower end of the descending portion 17 is bent rearward to form the board connecting portion 16. The first and second terminals 11A, 11B are distinguished based on the height of the draw-out portion 13 of the terminal 11 from the upper surface of the circuit board 40.

The board connecting portion 16 is formed behind and continuous with the plate material formed with the second contact surface 36. Since the board connecting portion 16 can be positioned by the housing 20 and the second contact surface 36 in this way, the positioning accuracy of the board connecting portion 16 with respect to the housing 20 can be improved.

[Fixing Brackets 30]

As shown in FIG. 2, the fixing brackets 30 for fixing the housing 20 on the circuit board 40 by soldering are mounted on both left and right surfaces of the housing 20. The fixing bracket 30 is formed by press-working a metal plate. Mounting grooves 27 for mounting the fixing brackets 30 are formed in left and right side walls 26 of the housing 20. Mounting ribs 37 to be fit into the mounting groove 27 are formed by bending on side edges of the fixing bracket 30. As shown in FIG. 1, a lower end part of the fixing bracket 30 is soldered to the fixing land 42 provided on the circuit board 40.

[Manufacturing Process of Board Connector 10]

Next, an example of a manufacturing process of the board connector 10 according to this embodiment is described. Note that the manufacturing process of the board connector 10 is not limited to the one described below.

As shown in FIGS. 5 to 8, the terminal 11 is formed by press-working the metal plate material into a predetermined shape. The housing 20 is formed by injection-molding a synthetic resin material.

Figure 9:
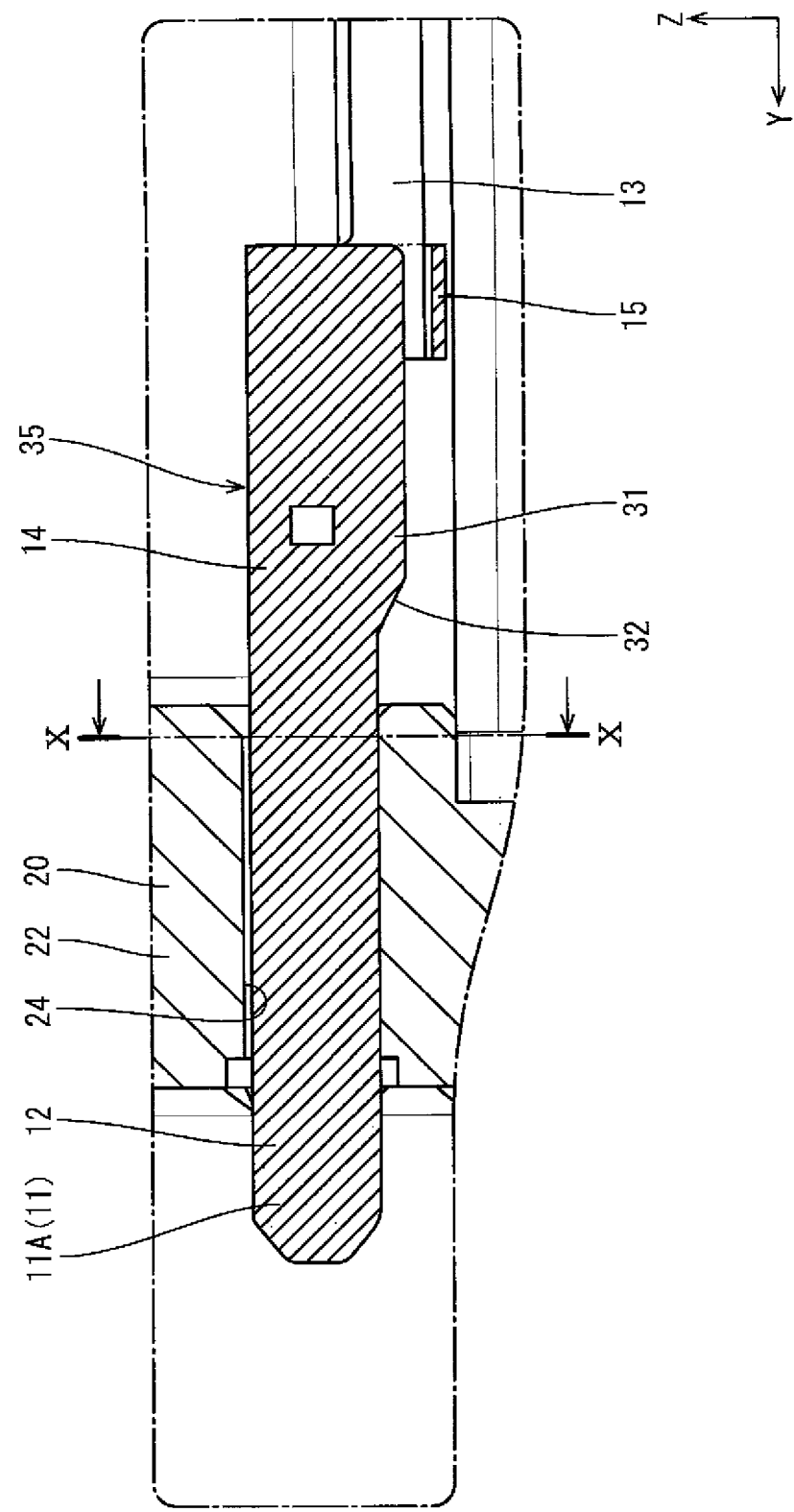
FIG. 9 is a partial enlarged section showing a state where a terminal contact portion is inserted in a terminal insertion hole.

As shown in FIG. 9, the terminal contact portion 12 of the terminal 11 is inserted into the terminal insertion hole 24 of the housing 20 from behind. As shown in FIG. 10, a clearance is formed between the inner wall of the terminal insertion hole 24 and the inserting portion 14 in this state.

Figure 11:
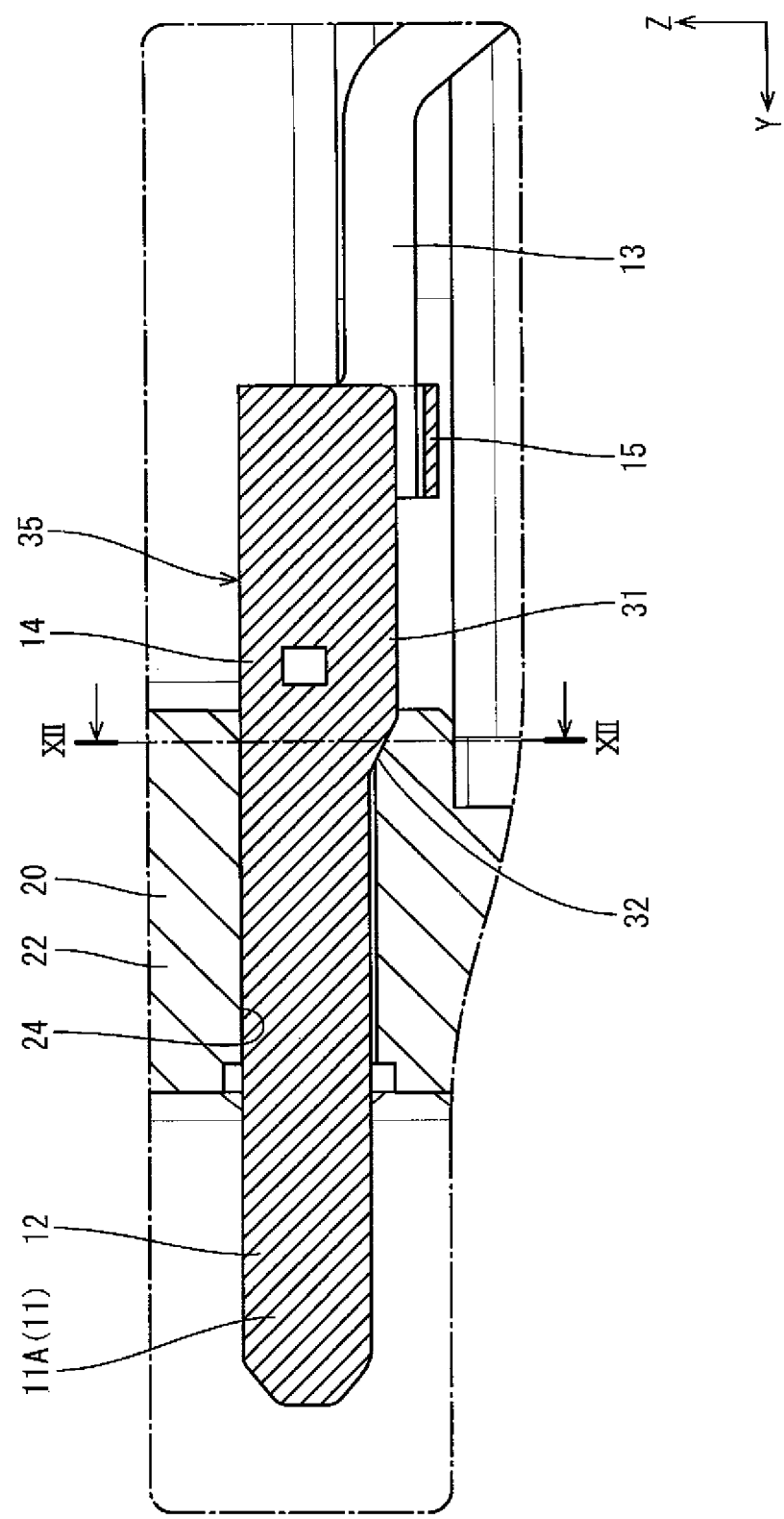
FIG. 11 is a partial enlarged section showing a state where a first press-fit portion is inserted in the terminal insertion hole.
Figure 12:
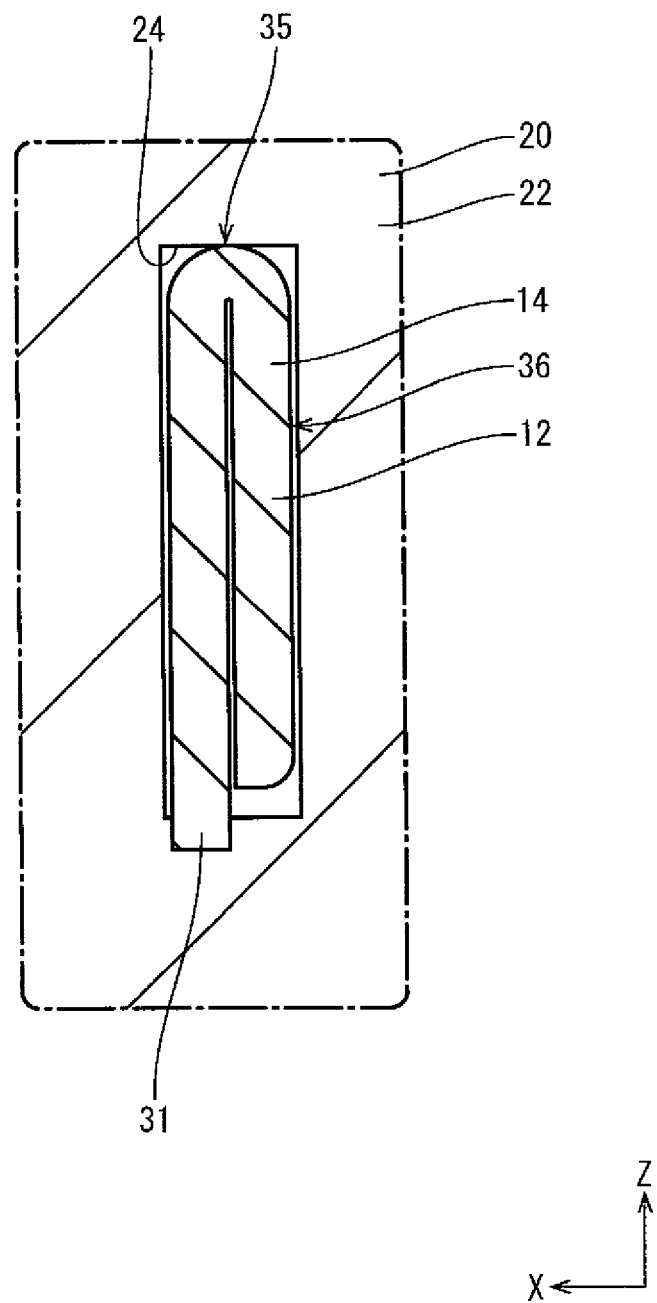
FIG. 12 is a section along XII-XII in FIG. 11.

If the terminal 11 is inserted farther, as shown in FIG. 11, the first inclined surface 32 of the first press-fit portion 31 contacts the edge of the terminal insertion hole 24 from behind. Then, the inserting portion 14 of the terminal 11 is guided upward by the sliding contact of the first inclined surface 32 and the edge of the terminal insertion hole 24. If the terminal 11 is inserted farther, the first press-fit portion 31 is press-fit to the lower wall of the terminal insertion hole 24, and the first contact surface 35 of the inserting portion 14 comes into surface contact with the upper wall of the terminal insertion hole 24 (see FIG. 11). In this way, the terminal 11 and the housing 20 are positioned in the vertical direction.

Figure 13:
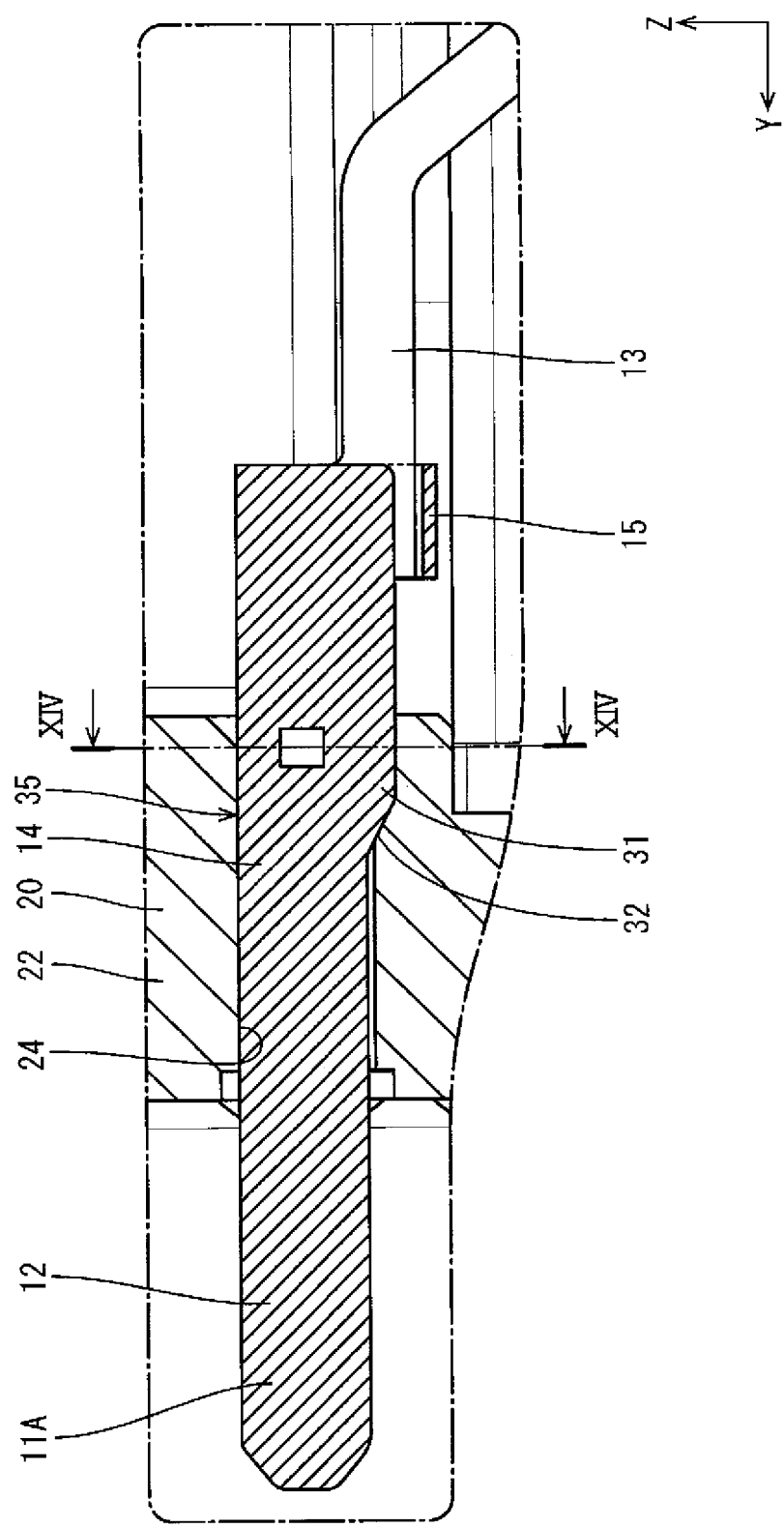
FIG. 13 is a partial enlarged section showing a state where a second press-fit portion is inserted in the terminal insertion hole.
Figure 14:
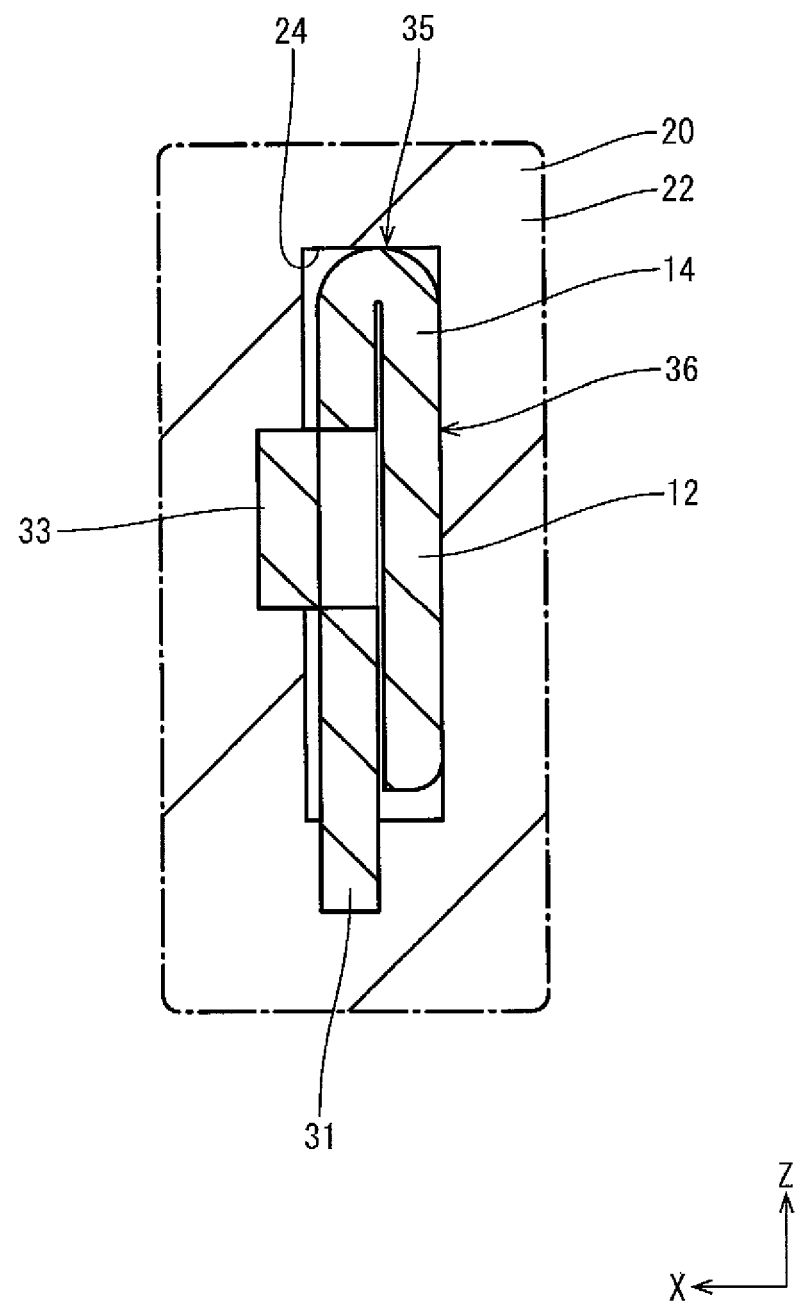
FIG. 14 is a section along XIV-XIV in FIG. 13.

If the terminal 11 is inserted farther, as shown in FIG. 13, the second inclined surface 34 of the second press-fit portion 33 contacts the edge of the terminal insertion hole 24 from behind. Then, the inserting portion 14 of the terminal 11 is guided to the right by the sliding contact of the second inclined surface 34 and the edge of the terminal insertion hole 24. If the terminal 11 is inserted farther, the second press-fit portion 33 is press-fit to the left side wall of the terminal insertion hole 24 and the second contact surface 36 of the inserting portion 14 comes into surface contact with the right side wall of the terminal insertion hole 24 (see FIG. 14). In this way, the terminal 11 and the housing 20 are positioned in the lateral direction.

If the terminal 11 is inserted farther, the stopper 15 contacts the edge of the terminal insertion hole 24 from behind (see FIG. 4). In this way, the terminal 11 is held in a state stopped in front with respect to the housing 20.

On the other hand, solder is applied in advance to the terminal lands 41 and the fixing lands 42 on the surface of the circuit board 40 where soldering is planned. Thereafter, the board connector 10 is placed at a predetermined position on the surface of the circuit board 40. At this time, the board connecting portions 16 of the terminals 11A, 11B are placed on the terminal lands 41 and the lower end edges of the fixing brackets 30 are placed on the fixing lands 42.

The circuit board 40 having the board connector 10 placed thereon is passed in a reflow furnace (not shown) in this state. Thus, the solder applied in advance to the circuit board 40 is melted and adheres to the board connecting portions 16 of the terminals 11A, 11B. Further, the molten solder adheres to the lower edges of the fixing brackets 30. The solder is cooled and solidifies to fix and conductively connect the board connecting portions 16 of the terminals 11A, 11B to the terminal lands 41. Thus, the fixing brackets 30 are fixed to the fixing lands 42 and the entire board connector 10 is fixed to the circuit board 40 (see FIG. 1).

[Functions and Effects of Embodiment]

Next, functions and effects of this embodiment are described below. The terminal 11 according to this embodiment is mounted into the housing 20 mounted on the circuit board 40 and includes the terminal contact portion 12, the inserting portion 14 and the board connecting portion 16. The terminal contact portion 12 is to be disposed in the forwardly open receptacle 21 of the housing 20, the inserting portion 14 is to be inserted into the terminal insertion hole 24 penetrating through the rear wall of the receptacle 21 in the front-rear direction, and the board connecting portion 16 is to be drawn out rearward from the terminal insertion hole 24 and connected to the circuit board 40. The inserting portion 14 includes the first press-fit portion 31 projecting down to intersect the circuit board 40 and to be press-fit to the inner wall of the terminal insertion hole 24 and the second press-fit portion 33 projecting left and to be press-fit to the inner wall of the terminal insertion hole 24.

Further, the board connector 10 includes the terminals 11 and the housing 20 to be mounted on the circuit board 40. The housing 10 includes the receptacle 21 open forward and the terminal insertion holes 24 penetrating through the rear wall of the receptacle 21 in the front-rear direction.

If the first press-fit portion 31 is press-fit to the inner wall of the terminal insertion hole 24, the upper wall of the inserting portion 14 contacts the upper wall of the terminal insertion hole 24 from below. Since the housing 20 and the terminal 11 are positioned in the vertical direction in this way, the positioning accuracy of the circuit board 40 and the board connecting portion 16 to be connected to the circuit board 40 in the vertical direction can be improved.

The board connector 10 is mounted on the circuit board 40. Thus, the relative positioning accuracy of the terminals 11 disposed in the board connector 10 and the terminal lands 41 on the circuit board 40 is very important. In other words, the coplanarity of the terminals 11 disposed in the board connector 10 and the terminal lands 41 formed on the surface of the circuit board 40 is important. Positioning accuracy of the board connecting portions 16 of the terminals 11 can be controlled reliably by the accuracy of the housing 20 according to this embodiment. Therefore, the coplanarity can be improved.

Further, the second press-fit portion 33 is press-fit to the inner wall of the terminal insertion hole 24. Thus, the right side wall of the inserting portion 14 contacts the right side wall of the terminal insertion hole 24. In this way, the housing 20 and the terminal 11 are positioned in the lateral direction, and the positioning accuracy of the circuit board 40 and the board connecting portion 16 to be connected to the circuit board 40 can be improved. According to this embodiment, the positioning accuracy of the terminal 11 in the lateral direction with respect to the housing 20, i.e. so-called alignment, can be improved.

Further, the front part of the first press-fit portion 31 is located in front of the second press-fit portion 33. This causes the first press-fit portion 31 to be press-fit to the inner wall of the terminal insertion hole 24 earlier than the second press-fit portion 33 when the inserting portion 14 is inserted into the terminal insertion hole 24. In this way, the terminal 11 and the housing 20 initially are positioned relative to each other in the vertical direction. This positioning accuracy of the circuit board 40 and the board connecting portion 16 to be connected to the circuit board 40 improves the coplanarity.

Further, the draw-out portion 13 is provided between the inserting portion 14 and the board connecting portion 16 and is to be drawn out rearward from the terminal insertion hole 24 to extend rearward. Additionally, the stopper 15 projects from the draw-out portion 13 in a direction intersecting the front-rear direction and is configured to contact the edge of the terminal insertion hole 24 from behind.

The terminal 11 is held in the state stopped in front with respect to the receptacle 21 by the contact of the stopper 15 with the edge of the terminal insertion hole 24 from behind. In this way, the positioning accuracy of the housing 20 and the terminal 11 in the front-rear direction is improved.

According to this embodiment, the inserting portion 14 is formed with the first contact surface 35 configured to contact the inner wall of the terminal insertion hole 24 on a side opposite to the first press-fit portion 31. The surface contact of the first contact surface 35 with the inner wall of the terminal insertion hole 24 improves the positioning accuracy of the terminal 11 and the housing 20 in the vertical direction.

The inserting portion 14 is formed with the second contact surface 36 configured to contact the inner wall of the terminal insertion hole 24 on a side opposite to the second press-fit portion 33. The surface contact of the second contact surface 36 with the inner wall of the terminal insertion hole 24 improves the positioning accuracy of the terminal 11 and the housing 20 in the lateral direction.

The present disclosure is applicable also to connectors in which terminals 11 are mounted in one, three or more stages.

The first press-fit portion 31 may project upward of the inserting portion 14. Further, the second press-fit portion 33 may project to the right of the inserting portion 14.

The housing 20 and the circuit board 40 may be fixed by bolts and nuts or other means.

The relative positions of the first and second press-fit portions 31, 33 in the front-rear direction are not limited. The second press-fit portion may be disposed in front of the first press-fit portion 31 or the first press-fit portion 31 and the second press-fit portion may be disposed at the same position in the front-rear direction.

LIST OF REFERENCE SIGNS

10: board connector
11: terminal
11A: first terminal
11B: second terminal
12: terminal contact portion
13: draw-out portion
14: inserting portion
15: stopper
16: board connecting portion
17: descending portion
20: housing
21: receptacle
22: rear wall
24: terminal insertion hole
26: side wall
27: mounting groove
30: fixing bracket
31: first press-fit portion
32: first inclined surface
33: second press-fit portion
34: second inclined surface
35: first contact surface
36: second contact surface
37: mounting rib
40: circuit board
41: terminal land
42: fixing land

What is claimed is:

1. A terminal to be mounted into a housing mounted on a circuit board, comprising:
   a terminal contact portion adjacent a front end of the terminal and to be disposed in a forwardly open receptacle of the housing;
   an inserting portion to be inserted into a terminal insertion hole penetrating through a rear wall of the receptacle in a front-rear direction
   a board connecting portion to be drawn out rearward from the terminal insertion hole and connected to the circuit board;
   a first contact surface extending from the terminal contact portion and along the inserting portion;
   a second contact surface angularly aligned to the first contact surface, the second contact surface extending from the terminal contact portion and along the inserting portion;
   the inserting portion including a first press-fit portion opposite the first contact surface and projecting in a first direction intersecting the circuit board and to be press-fit to an inner wall of the terminal insertion hole; and
   a second press-fit portion opposite the second contact surface and projecting in a second direction intersecting the first direction and to be press-fit to the inner wall of the terminal insertion hole, wherein
   a front part of the first press-fit portion is located in front of the second press-fit portion and a rear part of the first press-fit portion is rearward of the second press-fit portion.

2. The terminal of claim 1, wherein a draw-out portion to be drawn out rearward from the terminal insertion hole and extending rearward is provided between the inserting portion and the board connecting portion, and a stopper configured to contact an edge of the terminal insertion hole from behind projects in a direction intersecting the front-rear direction from the draw-out portion.

3. The terminal of claim 2, wherein the inserting portion is formed with a first contact surface configured to contact the inner wall of the terminal insertion hole on a side opposite to the first press-fit portion in the first direction.

4. The terminal of claim 3, wherein the inserting portion is formed with a second contact surface configured to contact the inner wall of the terminal insertion hole on a side opposite to the second press-fit portion in the second direction.

5. The terminal of claim 1, wherein a draw-out portion to be drawn out rearward from the terminal insertion hole and extending rearward is provided between the inserting portion and the board connecting portion, and a stopper configured to contact an edge of the terminal insertion hole from behind projects in a direction intersecting the front-rear direction from the draw-out portion.

6. The terminal of claim 1, wherein the first contact surface is configured to contact the inner wall of the terminal insertion hole on a side opposite to the first press-fit portion in the first direction.

7. The terminal of claim 6, wherein the second contact surface configured to contact the inner wall of the terminal insertion hole on a side opposite to the second press-fit portion in the second direction.

8. The terminal of claim 1 wherein the terminal contact portion and the inserting portion are formed from a first plate and a second plate that is folded relative to the first plate, a fold between the first and second plates defining the first contact surface, the second contact surface being defined by a surface of the first plate facing away from the second plate.

9. The terminal of claim 8, wherein the second press-fit portion is a projection on a part of the inserting portion defined by the second plate and the second press-fit portion projecting away from the first plate.

10. The terminal of claim 8, further comprising a stopper extending from a portion of the first plate adjacent a rear end of the inserting portion and bent to engage a surface of the second plate facing away from the first plate, the stopper being engageable with a rear end of the housing to limit insertion of the terminal into the terminal insertion hole.

11. The terminal of claim 8, wherein the board connecting portion extends rearward from the first plate at a rear end of the inserting portion.

12. A board connector, comprising:
a housing to be mounted on a circuit board,
the housing including a forwardly open receptacle and a terminal insertion hole penetrating through a rear wall of the receptacle in a front-rear direction; and
a terminal mounted into the housing, the terminal including:
  a terminal contact portion adjacent a front end of the terminal and to be disposed in a forwardly open receptacle of the housing;
  an inserting portion to be inserted into a terminal insertion hole penetrating through a rear wall of the receptacle in a front-rear direction
  a board connecting portion to be drawn out rearward from the terminal insertion hole and connected to the circuit board;
  a first contact surface extending from the terminal contact portion and along the inserting portion;
  a second contact surface angularly aligned to the first contact surface, the second contact surface extending from the terminal contact portion and along the inserting portion;
  the inserting portion including a first press-fit portion opposite the first contact surface and projecting in a first direction intersecting the circuit board and to be press-fit to an inner wall of the terminal insertion hole; and
  a second press-fit portion opposite the second contact surface and projecting in a second direction intersecting the first direction and to be press-fit to the inner wall of the terminal insertion hole, wherein
  a front part of the first press-fit portion is located in front of the second press-fit portion and a rear part of the first press-fit portion is rearward of the second press-fit portion.

* * * * *